(12) United States Patent
Tokuhisa et al.

(10) Patent No.: US 9,083,151 B2
(45) Date of Patent: Jul. 14, 2015

(54) METHOD FOR HAVING LASER LIGHT SOURCE IN STANDBY STATUS

(75) Inventors: Akira Tokuhisa, Tokyo (JP); Yasutoshi Takada, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 13/154,705

(22) Filed: Jun. 7, 2011

(65) Prior Publication Data

US 2011/0268142 A1 Nov. 3, 2011

Related U.S. Application Data

(63) Continuation of application No. 11/992,321, filed as application No. PCT/JP2006/321472 on Oct. 27, 2006, now Pat. No. 7,974,320.

(30) Foreign Application Priority Data

Nov. 10, 2005 (JP) .................. 2005-325862

(51) Int. Cl.
*H01S 3/10* (2006.01)
*H01S 3/23* (2006.01)
*G02F 1/35* (2006.01)
(Continued)

(52) U.S. Cl.
CPC ............ *H01S 3/2383* (2013.01); *G02F 1/3534* (2013.01); *H01S 3/10007* (2013.01); *G02F 1/3532* (2013.01); *G02F 2001/354* (2013.01); *H01S 3/005* (2013.01); *H01S 3/06754* (2013.01);
(Continued)

(58) Field of Classification Search
USPC .......................................................... 372/22
See application file for complete search history.

(56) References Cited

U.S. PATENT DOCUMENTS 4,660,204 A * 4/1987 Dewhirst et al. ................ 372/16
5,060,233 A 10/1991 Harder et al.
(Continued)

FOREIGN PATENT DOCUMENTS

EP 1 281 378 A1 2/2003
EP 1 571 741 A1 9/2005
(Continued)

OTHER PUBLICATIONS

Sep. 28, 2009 Extended European Search Report issued in European Patent Application No. 06832396.3.
(Continued)

*Primary Examiner* — Xinning Niu
(74) *Attorney, Agent, or Firm* — Oliff PLC

(57) ABSTRACT

When the laser light source is caused to standby, the temperatures of semiconductor lasers are changed by approximately 3° C. from the temperature when the laser light source is always being used. With a temperature change of approximately 3° C., the wavelengths of the laser light generated by the semiconductor lasers change approximately 0.3 nm. This change hardly has any effect at all on optical fiber amplifiers, but the conversion efficiencies at the respective wavelength conversion elements of the wavelength conversion optical system change, and, particularly, deep ultraviolet light is hardly generated at all any longer. Therefore, even while the laser light has been made incident to the wavelength conversion optical system, there is no longer damaging of the wavelength conversion elements. Therefore, it is possible to provide a laser light source standby method that is able to shorten the start up time of the laser light source.

5 Claims, 2 Drawing Sheets

(51) Int. Cl.
  *H01S 3/00* (2006.01)
  *H01S 3/067* (2006.01)
  *H01S 5/06* (2006.01)

(52) U.S. Cl.
  CPC ........... *H01S 3/10015* (2013.01); *H01S 5/0612* (2013.01)

(56) References Cited

U.S. PATENT DOCUMENTS

| | | | |
|---|---|---|---|
| 5,867,305 A * | 2/1999 | Waarts et al. | 359/337.12 |
| 6,058,126 A | 5/2000 | Ishikawa et al. | |
| 6,249,371 B1 * | 6/2001 | Masuda et al. | 359/326 |
| 6,347,102 B1 | 2/2002 | Konno et al. | |
| 6,490,309 B1 | 12/2002 | Okazaki et al. | |
| 7,110,426 B2 * | 9/2006 | Masuda | 372/21 |
| 7,329,251 B2 * | 2/2008 | Yamada et al. | 606/4 |
| 2003/0065312 A1 | 4/2003 | Owa et al. | |
| 2005/0134958 A1 | 6/2005 | Huang et al. | |
| 2005/0259314 A1 | 11/2005 | Tokuhisa et al. | |

FOREIGN PATENT DOCUMENTS

| | | |
|---|---|---|
| JP | A-4-109226 | 4/1992 |
| JP | A-10-153806 | 6/1998 |
| JP | A-2001-353176 | 12/2001 |
| KR | 20030009432 A | 1/2003 |
| WO | WO 2004/054050 A1 | 6/2004 |

OTHER PUBLICATIONS

Apr. 9, 2013 Office Action issued in Korean Patent Application No. 10-2008-7003686.

Oct. 24, 2014 Office Action issued in Korean Patent Application No. 10-2008-7003686.

Feb. 11, 2015 Office Action issued in Korean Application No. 10-2008-7003686.

* cited by examiner

METHOD FOR HAVING LASER LIGHT SOURCE IN STANDBY STATUS

This application is a continuation of U.S. patent application Ser. No. 11/992,321, filed on Apr. 15, 2008, which is a National Stage of PCT/JP2006/321472 filed Oct. 27, 2006, and which claims priority to Japanese Application No. 2005-325862 filed on Nov. 10, 2005. The entire disclosures of the prior applications are hereby incorporated herein by reference in their entirety.

TECHNICAL FIELD

The present invention relates to a method of causing standby (including a method of turning ON and OFF at a high speed) of a laser light source that uses optical fiber amplifiers to perform light amplification of laser light generated from semiconductor lasers and then the forms deep ultraviolet light by means of a wavelength conversion optical system that uses wavelength conversion elements.

BACKGROUND ART

Laser light has been used for a variety of applications in recent years, for example, it performs metal cutting and processing, it is used as the light source of photolithography apparatuses in semiconductor fabrication apparatuses, it is used in various measuring apparatuses, and it is used in medical operation and treatment apparatuses such as in surgery, ophthalmology and dentistry.

In the case in which a solid state laser (in the present specification, a semiconductor laser (used as a concept that includes diode lasers)) is used as such a laser light source, the wavelength of the laser light that is emitted from the solid state laser is from the visible range to the infrared range, and a method of directly generating ultraviolet light has not been established. For example, it is not suitable for use in inspecting apparatuses, since the wavelength is too long. Therefore, a method of using such long wavelength light emitted from a solid state laser by converting it into a deep ultraviolet light of a short wavelength (for example, an eighth harmonic: wavelength of 193 nm) by using nonlinear optical crystals has been developed, for example, as described in Japanese Patent Application Publication No. 2001-353176 (Patent Document 1). BBO crystals, LBO crystals and CLBO crystals are known nonlinear optical crystals used for such a purpose.

In an such a laser light source, for example, in general, laser light generated from a DFB-LD is amplified using a plurality of optical fiber amplifiers (FDFA) and is then made into deep ultraviolet light by means of a wavelength conversion optical system such as the above.
Patent Document 1: Japanese Unexamined Patent Application Publication No. 2001-353176

DISCLOSURE OF THE INVENTION

Problems to be Solved by the Invention

Optical fiber amplifiers used for such a purpose, particularly optical fiber amplifiers that amplify light with a wavelength of 1.55 μm to which Er has been added, generate a large amount of heat during high output operations. In addition, when such optical fiber amplifiers are turned ON and OFF, large temperature changes are generated, and, at such times, various unstable statuses are caused. When such optical fiber amplifiers are used in compact packages, the temperature of the housing increases due to the heat generation of the optical fiber amplifiers of subsequent stages of high output operations, and, in conjunction with this, the temperatures of optical fiber of the preceding stages of low output operation, in which heat generation is not performed, also increase. When the temperature of the optical fiber increases, in conjunction with this, the status of polarization of the light output from the optical fiber amplifiers changes. When the status of polarization changes, there is a problem in that the conversion efficiency in the wavelength conversion optical system, into which the output from the optical fiber amplifiers is input, changes, and the laser output light ultimately obtained fluctuates.

Therefore, conventionally, a method has been employed in which, before usage of such a laser light source starts, a warm up of a considerable time is performed, thermal equilibrium is established, fluctuation of the laser output light ultimately obtained is held within an allowable range and then usage is started. However, there are cases in which approximately 24 hours would be necessary until thermal equilibrium is established, and that length of time has been a problem.

As a countermeasure for this, a method in which the laser light source is always put into the output status even while the output light from the laser light source is not being used is conceivable. However, when the laser light source is put into an ON status, the wavelength conversion elements, which are used in the deep ultraviolet light generating portion, or optical elements such as a lenses are damaged, so there is a problem in that maintaining an output status until the time when output light is not used is linked to shortening of the lifespan of the laser light source. As another countermeasure, blocking the laser light using a mechanical shutter before light from the optical fiber amplifiers enters the wavelength conversion optical system is conceivable. However, in this case, the thermal equilibrium of the wavelength conversion optical system breaks down, and, as a result, there is a problem in that fluctuation of the laser output light ultimately obtained cannot be avoided.

The present invention takes such circumstances into account and has as its problem the provision of a laser light source standby method that is able to optically amplify laser light generated from laser oscillating parts using optical fiber amplifiers and then shorten the start up time of a laser light source that performs wavelength conversion by means of a wavelength conversion optical system that uses wavelength conversion elements, as well as a method of turning ON and OFF at a higher speed.

Means to Solve Problems

The first means for solving the above problems is a laser light source standby method that causes standby of a laser light source that performs wavelength conversion of laser light generated from laser oscillating parts by means of a wavelength conversion optical system that uses wavelength conversion elements; characterized in that it reduces the wavelength conversion efficiencies of the wavelength conversion elements during standby.

When the wavelength conversion efficiencies of the wavelength conversion elements are reduced, there is a reduction in the output of the converted frequency light that is generated, and, particularly, deep ultraviolet light is hardly generated at all any longer. Therefore, there comes to be extremely little damaging of the wavelength conversion elements by deep ultraviolet light. In changing the laser light source from a standby status to a usage status, a usage status is promptly set by returning the wavelength conversion efficiencies of the wavelength conversion elements to their original settings.

Note that, in the present specification and the Scope of Patent Claims, "reduces the wavelength conversion efficiencies of the wavelength conversion elements" is used with a meaning that includes the case in which they become completely 0.

The second means for solving the above problems is the first means; characterized in that the wavelength-converted laser light is deep ultraviolet light.

The third means for solving the above problems is the first means; characterized in that the method of reducing the wavelength conversion efficiencies of the wavelength conversion elements is setting the temperature that controls the oscillation wavelength of at least one of semiconductor lasers that comprise the laser oscillating parts to a temperature that differs from the temperature of the case in which the laser light source is always being used.

Note that, in the present specification and the Scope of Patent Claims, "the laser light source is always being used" refers to the desired laser light being output from the laser light source.

During standby, when the temperatures of the semiconductor lasers are temperatures different from the temperatures in a case in which the laser light source is always being used, the wavelengths of the laser light (fundamental harmonic) generated from the semiconductor lasers change. Even if this is done, the output of the optical fiber amplifiers is maintained to be nearly constant and enters the wavelength conversion optical system, so thermal equilibrium of the optical fiber amplifiers and the wavelength conversion optical system is maintained at the same level as when a laser light source is used. The output from the optical fiber amplifiers is sent as-is to the wavelength conversion optical system, but wavelength conversion efficiencies drop due to the wavelengths being different, and, particularly, deep ultraviolet light is hardly generated at all any longer. Therefore, there comes to be extremely little damaging of the wavelength conversion elements by deep ultraviolet light. In the case in which there is a shift from a standby status to a usage status, the temperatures of the semiconductor lasers should be returned to their original settings. Temperature changes need only be slight, and the thermal capacities of the semiconductor lasers are small, so the shift from standby to a usage status is promptly performed.

The fourth means for solving the above problems is the first means; characterized in that the method of reducing the wavelength conversion efficiencies of the wavelength conversion elements is to make the temperature of at least one of the temperature-controlled wavelength conversion elements among the wavelength conversion elements [a] [Translator's note: presumed omission in Japanese original] temperature that differs from the temperature in the case in which the laser light source is always being used.

When the laser light source is set to a standby status, the temperatures of the wavelength conversion elements are changed from the temperature when the laser light source is always being used. By doing so, the phase matching status of the wavelength conversion elements breaks down, wavelength conversion efficiency drops, and, particularly, deep ultraviolet light is hardly generated at all. Therefore, there comes to be extremely little damaging of the wavelength conversion elements by deep ultraviolet light. In the case in which there is a shift from a standby status to a usage status, the temperatures of the wavelength conversion elements should be returned to their original settings. Temperature changes need only be slight, and the thermal capacities of the wavelength conversion elements are small, so the shift from standby to the usage status is promptly performed. Particularly, it is preferable that the temperatures of the temperature phase matching crystal used in preceding stages of the wavelength conversion optical system be changed.

The fifth means for solving the above problems is the first means; characterized in that the wavelength conversion elements are nonlinear optical crystals, and the method of reducing the wavelength conversion efficiencies of the wavelength conversion elements is to make the angle formed by the crystal axes of the nonlinear optical crystals and the optical axis an angle that differs from the angle in the case in which the laser light source is always being used.

The sixth means of solving the above problems is the first means; characterized in that the laser light source is one that optically amplifies laser light using optical fiber amplifiers.

The seventh means for solving the above problems is a method of causing standby of a laser light source that forms deep ultraviolet light from laser light generated from a plurality of laser oscillating parts by means of a wavelength conversion optical system that uses wavelength conversion elements; characterized in that, during standby, the relative relationship of the timing of the pulsed laser light generated from the respective laser oscillating parts is shifted from the relative relationship in the case in which the laser light source is always being used.

In a laser light source that forms deep ultraviolet light from laser light generated from a plurality of laser oscillating parts by means of a wavelength conversion optical system that uses wavelength conversion elements, wavelength conversion is performed by matching the phases of the pulsed laser light generated from these respective laser oscillating parts to the same optical axis and causing them to be incident to the wavelength conversion elements. Therefore, when the relationship of the timing of pulses generated from the respective laser oscillating parts is shifted from the timing in the case in which these laser light sources are always being used, the phases thereof no longer match, the conversion efficiencies of the wavelength conversion elements drop, and, particularly, deep ultraviolet light is hardly generated at all any longer. In the case in which there is a shift from a standby status to a usage status, it is possible to extremely promptly shift to a usage status by making the phases match.

Note that, in the present means, control is performed by shifting the timing of the pulses generated from the laser oscillating parts, so control on the nsec order is possible. Therefore, the time of the "standby" status can be made extremely short, and the concept includes time on the nsec order, for example. Therefore, through the present means, turning ON and OFF in pulsed units, generation of any pulse pattern, and control of pulse energy become possible.

The eighth means of solving the above problems is the seventh means; characterized in that the laser oscillating parts have semiconductor lasers and electrooptical elements (EOMs), and the relative relationship of the timing of the pulsed laser light generated from the respective laser oscillating parts is the relative relationship of the pulsed laser light generated from the semiconductor lasers or the relative relationship of the timing of the pulsed laser light pulse-extracted by the EOMs.

The ninth means for solving the above problems is the seventh means; characterized in that the laser light source is one that optically amplifies the respective laser lights using optical fiber amplifiers provided to correspond to the respective laser oscillators.

Effects of the Invention

Through the present invention, it is possible to provide a laser light source standby method that optically amplifies laser light generated from the laser oscillating parts using optical fiber amplifiers and then shortens start up time of a laser light source that performs wavelength conversion by means of a wavelength conversion optical system that uses wavelength conversion elements, as well as a method of turning ON and OFF at a higher speed.

BRIEF DESCRIPTION OF THE DRAWINGS

FIG. 1 is a drawing that describes the standby method of the laser light source that is the first embodiment of the present invention.

FIG. 2 is a drawing that shows an eighth harmonic pulse waveform when the pulse generation timing has been shifted.

Figure 1:
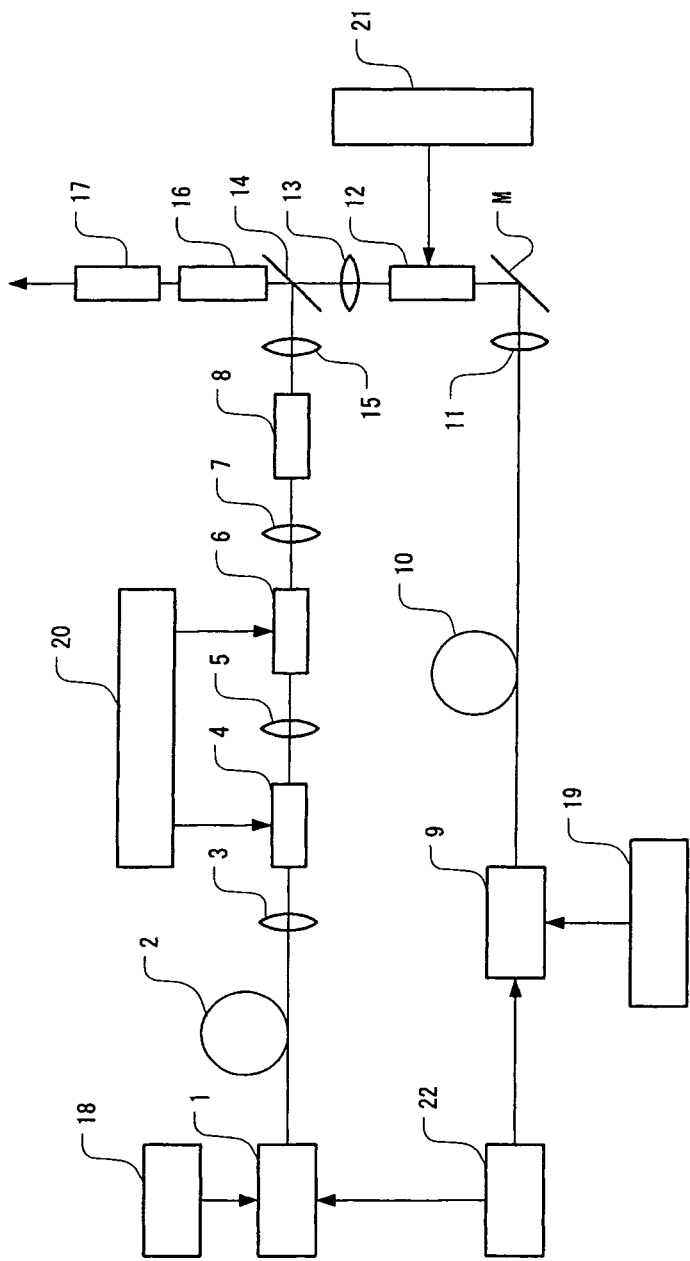
FIG. 1

DESCRIPTION OF SYMBOLS 1 semiconductor laser
2 optical fiber amplifier
3 condenser lens
4 second harmonic generator
5 condenser lens
6 third harmonic generator
7 condenser lens
8 fifth harmonic generator
9 semiconductor laser
10 optical fiber amplifier
11 condenser lens
12 second harmonic generator
13 condenser lens
14 dichroic mirror
15 condenser lens
16 seventh harmonic generator
17 eighth harmonic generator
18 LD temperature controller
19 LD temperature controller
20 crystal temperature controller
21 crystal temperature controller
22 pulse generator

PREFERRED EMBODIMENT OF THE PRESENT INVENTION

Examples of embodiments of the present invention will be described below using drawings. FIG. 1 is a drawing that describes the standby method of a laser light source that is an embodiment of the present invention, and it is a drawing that shows an overview of the laser light source.

Laser light (fundamental harmonic) emitted from a first semiconductor laser 1 (DFB-LD) is amplified by a first optical fiber amplifier 2 (FDFA) and is incident to a wavelength conversion optical system. The light that has entered the wavelength conversion optical system is, first, condensed to a second harmonic generator 4 comprised of LBO by means of a condenser lens 3, and a second harmonic is generated from second harmonic generator 4 along with the fundamental harmonic. These lights are condensed to a third harmonic generator 6 comprised of LBO by means of a condenser lens 5, and a third harmonic is generated from third harmonic generator 6 along with a second harmonic. These lights are condensed to a fifth harmonic generator 8 comprised of BBO by means of a condenser lens 7, and a fifth harmonic is generated from a fifth harmonic generator 8.

On the other hand, laser light (fundamental harmonic) emitted from a second semiconductor laser 9 (DFB-LD) is amplified by a second optical fiber amplifier 10 (FDFA) and is incident to a wavelength conversion optical system. The light that has entered the wavelength conversion optical system is, first, condensed to a second harmonic generator 12 comprised of LBO via a mirror M by means of a condenser lens 11, and a second harmonic is generated from second harmonic generator 12 along with the fundamental harmonic. These lights pass through a condenser lens 13 and a dichroic mirror 14 and are condensed to a seventh harmonic generator 16 comprised of CLBO. First, a fifth harmonic generated from fifth harmonic generator 8 passes through a condenser lens 15, is reflected by the dichroic mirror 14, and is converged to the seventh harmonic generator 16. A seventh harmonic is generated from seventh harmonic generator 16, but the fundamental harmonic that has entered seventh harmonic generator 16 along with a second harmonic passes through seventh harmonic generator 16 as-is, and a seventh harmonic and the fundamental harmonic are converged to an eighth harmonic generator 17 comprised of CLBO. An eighth harmonic is generated from eighth harmonic generator 17, and this becomes laser light source output.

In the first embodiment, when such a laser light source is caused to standby, the temperatures of semiconductor laser 1 and semiconductor laser 9 are changed by approximately 3° C. from the normal temperature (normal temperature is approximately room temperature) when laser light (eighth harmonic) is output from the laser light source (when the laser light source is being used). Semiconductor laser 1 and semiconductor laser 9 are respectively temperature-controlled by LD temperature controllers 18 and 19, so it is possible to easily achieve temperature changes by changing the set temperatures thereof. At a temperature change of approximately 3° C., the wavelengths of the laser light generated from semiconductor lasers 1 and 9 change by approximately 0.3 nm. This change has hardly any effect on optical fiber amplifier 2 and optical fiber amplifier 10, but the conversion efficiencies in the respective wavelength conversion elements of the wavelength conversion optical system are changed, and, particularly, deep ultraviolet light is hardly generated at all any longer. Therefore, the wavelength conversion elements are no longer damaged even while the laser light has been made incident to the wavelength conversion optical system.

When shifting from a standby status to a usage status (a status that outputs laser light (eighth harmonic)), the settings of LD temperature controllers 18 and 19 may be varied to return the temperatures of semiconductor laser 1 and semiconductor laser 9 to their original settings, but only approximately one minute or less is needed until the temperatures are returned to their original settings, so the warm up time can be set to one minute or less. Note that changing of the temperature during standby need not be for both semiconductor laser 1 and semiconductor laser 9, and there will be effects even with only either one of these.

What extent of temperature change should be provided varies according to the wavelength conversion optical system, so, in the wavelength conversion optical system, temperature changes such that deep ultraviolet is no longer generated to the extent of becoming a problem should be experimentally determined and provided. In terms of shortening the warm up time, it is preferable to make the temperature change as small as possible.

In the second embodiment, when such a laser light source is caused to standby, the temperatures of second harmonic generator 4, third harmonic generator 6 and second harmonic generator 12 are changed approximately 1° C. from the temperature when the laser light source is always being used. Second harmonic generator 4, third harmonic generator 6 and second harmonic generator 12 are comprised of LBO, which is a temperature phase matching crystal, and they are used for making infrared light into visible light and for making visible light into visible light with a shorter wavelength. These wavelength conversion elements are temperature-controlled (normally 120° C.~150° C.) by crystal temperature controllers 20, 21, so changing the temperature is easy (note that other wavelength conversion elements are also temperature-controlled, but drawings of the temperature controllers have been omitted).

When the temperature is shifted by approximately 1° C., the phase matching statuses of these temperature phase matching crystals break down, and wavelength conversion efficiency drops. Therefore, generation of deep ultraviolet light greatly drops, and it is possible to prevent damage of wavelength conversion elements 16 and 17, which handle deep ultraviolet light.

When shifting from a standby status to an operation status, the settings of crystal temperature controllers 20 and 21 may be changed to return the temperatures of second harmonic generator 4, third harmonic generator 6 and second harmonic generator 12 to their original settings, but only approximately one minute or less is needed until the temperatures are returned to their original settings, so the warm up time can be set to one minute or less. Note that changing of the temperature during standby need not be for all of second harmonic generator 4, third harmonic generator 6 and second harmonic generator 12, and there will be effects even with only any one or two among these. Even if the temperature of the seventh harmonic generator 16 were changed, there would be effects to a certain extent. However, it is more effective to change the temperature of a harmonic generator of the most preceding stage possible.

What extent of temperature change should be provided varies according to the wavelength conversion optical system, so, in the wavelength conversion optical system, temperature changes such that deep ultraviolet is no longer generated to the extent of becoming a problem should be experimentally determined and provided. In terms of shortening the warm up time, it is preferable to make the temperature change as small as possible.

In the third embodiment, when such a laser light source is caused to standby, the timing of the pulse generated from semiconductor laser 1 and the timing of the pulse generated from semiconductor laser 9 are shifted by shifting the output timing of a pulse generator 22 that supplies signals to the respective semiconductor lasers 1, 9. In the wavelength conversion optical system, with the timing at which a fifth harmonic formed from the fundamental harmonic generated from semiconductor laser 1 is reflected by the dichroic mirror 14 and is incident to seventh harmonic generator 16 and the timing at which the fundamental harmonic generated from semiconductor laser 9 and a second harmonic formed therefrom pass through the dichroic mirror 14 and are incident to seventh harmonic generator 16 being the same, a second harmonic and a fifth harmonic from among these are superposed, thereby generating a seventh harmonic with good efficiency. When the timing of the pulse generated from this semiconductor laser 1 and the timing of the pulse generated from semiconductor laser 9 are shifted from the usage status timing, there is less superposing of a second harmonic and a fifth harmonic or there is no longer superposing at all. Through this, the seventh harmonic generation efficiency drops, or a seventh harmonic is no longer generated. Therefore, deep ultraviolet light generation drops, and there is no damage to seventh harmonic generator 16 and eighth harmonic generator 17.

Figure 2:
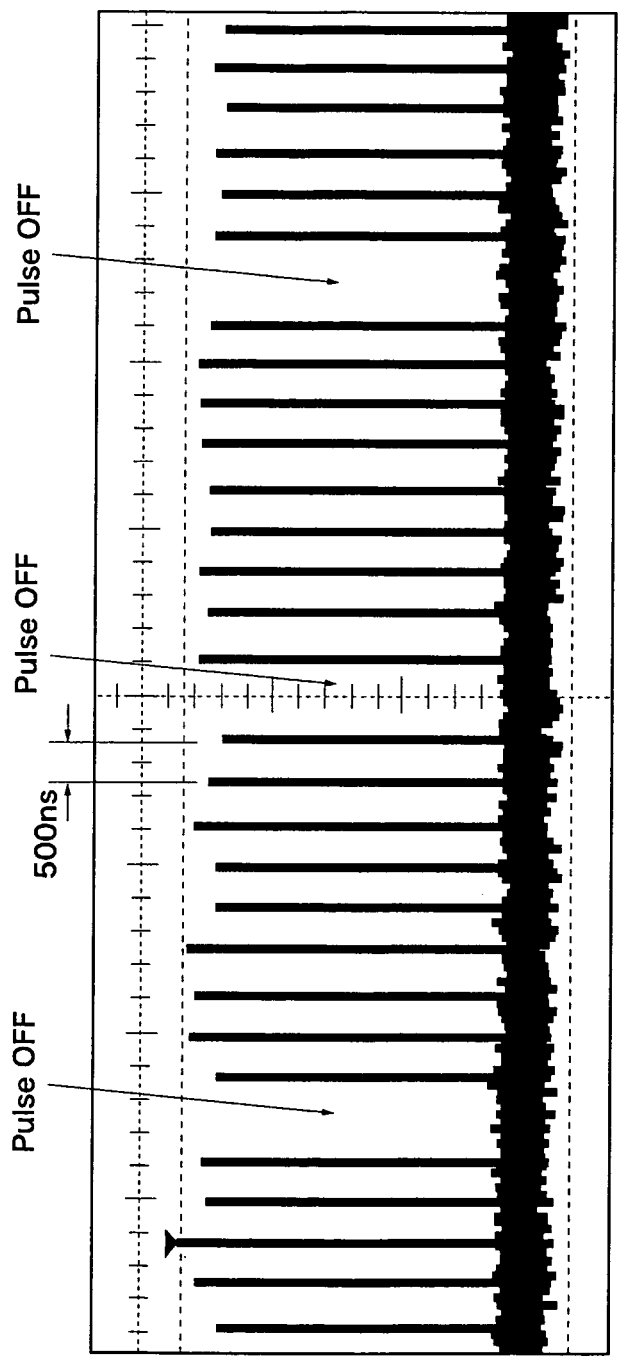
FIG. 2

In returning from a standby status to a usage status, the relative relationship of the pulse generation timing should be returned to its original setting, and it is possible to instantly return to a usage status. FIG. 2 is a drawing that shows an eighth harmonic pulse waveform when the pulse generation timing has been shifted in this way. In this case, an eighth harmonic is generated at 500 nsec intervals, but there is a place along the way in which one pulse is missing. This location is a location in which the relative relationship of the pulse generation timing has been shifted from a normal usage status. Specifically, in this case, it is understood that, at 500 nsec, there is a shift from a standby status to a usage status. In addition, if such a method is used, it is also possible to generate any pulse array pattern and to control the energy of the individual pulses.

In addition, electrooptical elements (EOMs) may be respectively arranged in the vicinity of semiconductor laser 1 and semiconductor laser 9, and the timing of extracting pulsed laser lights of the electrooptical elements may also be relatively shifted in order to relatively shift the timing of the pulsed laser light generated from the respective electrooptical elements. The description relating to the wavelength conversion optical system in this case is similar to that of the third embodiment.

In the above, descriptions have been given with respect to three embodiments, but the present invention is one that may be achieved if the wavelength conversion efficiencies of the wavelength conversion elements are reduced by any method. For example, in the case in which the wavelength conversion elements are nonlinear optical crystals, it is possible to realize the present invention even with a method such that the angle formed by the crystal axes thereof and the optical axis is changed or such that the positional relationship of the respective elements of the wavelength conversion optical system is changed.

The invention claimed is:

1. A laser light source standby method for a laser light source that uses optical fiber amplifiers to perform light amplification of laser light generated from semiconductor lasers and then forms deep ultraviolet light by means of a wavelength conversion optical system that uses a plurality of laser oscillating parts that are configured to form deep ultraviolet light, the method comprising:
   shifting, during standby, a relative relationship of a timing of the pulsed laser light generated from the respective laser oscillating parts from a relative relationship in the case in which the laser light source is always being used such that ultraviolet light generation drops while the output of the optical fiber amplifiers is maintained to be nearly constant and enters the wavelength conversion optical system, so thermal equilibrium of the optical fiber amplifiers is maintained at a level that a laser light source is used.

2. The laser light source standby method according to claim 1, wherein
   the laser oscillating parts include semiconductor lasers and electrooptical elements, and
   the relative relationship of the timing of the pulsed laser light generated from the respective laser oscillating parts is the relative relationship of the pulsed laser light generated from the semiconductor lasers or the relative relationship of the timing of the pulsed laser light pulse-extracted by the electrooptical elements.

3. The laser light source standby method according to claim 1, wherein
   the laser light source includes optical fiber amplifiers that correspond to the respective laser oscillators, and the laser light source is configured to optically amplify the respective laser lights using the optical fiber amplifiers.

4. The laser light source standby method according to claim 1, wherein the time of standby status is made such that any pulse pattern can be generated and pulse energy can be controlled.

5. The laser light source standby method according to claim 1, wherein the time of standby status is made such that the laser light source can be turned ON and OFF in pulsed units.

* * * * *